United States Patent
Nichol

(10) Patent No.: US 8,801,855 B2
(45) Date of Patent: *Aug. 12, 2014

(54) METHOD FOR PROCESSING SILICON POWDER TO OBTAIN SILICON CRYSTALS

(71) Applicant: Silicor Materials Inc., Palo Alto, CA (US)

(72) Inventor: Scott Nichol, Toronto (CA)

(73) Assignee: Silicor Materials Inc., Palo Alto, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/625,348

(22) Filed: Sep. 24, 2012

(65) Prior Publication Data

US 2013/0017140 A1    Jan. 17, 2013

Related U.S. Application Data

(63) Continuation of application No. 13/158,626, filed on Jun. 13, 2011, now Pat. No. 8,273,176, which is a continuation of application No. 12/244,839, filed on Oct. 3, 2008, now Pat. No. 7,959,730.

(60) Provisional application No. 60/977,249, filed on Oct. 3, 2007.

(51) Int. Cl.
- *C30B 9/04* (2006.01)
- *C30B 9/06* (2006.01)
- *C30B 9/10* (2006.01)
- *C30B 27/02* (2006.01)
- *C30B 28/10* (2006.01)
- *C01B 33/037* (2006.01)

(52) U.S. Cl.
USPC .................. 117/74; 117/13; 117/23; 117/73; 423/348; 423/658.5

(58) Field of Classification Search
USPC ............... 423/348, 658.5; 117/13, 23, 73, 74, 117/206, 223
See application file for complete search history.

(56) References Cited

U.S. PATENT DOCUMENTS

| | | |
|---|---|---|
| 2,818,330 A | 12/1957 | Beatty et al. |
| 2,990,372 A | 6/1961 | Pinter et al. |

(Continued)

FOREIGN PATENT DOCUMENTS

| | | |
|---|---|---|
| CN | 101460399 B | 3/2012 |
| EP | 0209954 A2 | 1/1987 |

(Continued)

OTHER PUBLICATIONS

""Modification of Aluminium-Silicon Foundry Alloys" 1998", Modification of Aluminium-Silicon Foundry Alloys, http://www.metallurgaluminium.comlDownloads/tech_paper_pdfs/Guide_ModiCAlSi_Alloys.pdf ., (Apr. 13, 2010).

(Continued)

*Primary Examiner* — Stuart Hendrickson
*Assistant Examiner* — Daniel Berns
(74) *Attorney, Agent, or Firm* — Schwegman, Lundberg & Woessner, P.A.

(57) ABSTRACT

Embodiments of the present invention relate to a process for obtaining silicon crystals from silicon. The method includes contacting silicon powder with a solvent metal to provide a mixture containing silicon, melting the silicon under submersion to provide a first molten liquid, contacting the first molten liquid with a first gas to provide dross and a second molten liquid, separating the dross and the second molten liquid, cooling the second molten liquid to form first silicon crystals and a first mother liquid and separating the first silicon crystals and the first mother liquid.

23 Claims, 2 Drawing Sheets

(56) References Cited

U.S. PATENT DOCUMENTS

| | | | |
|---|---|---|---|
| 3,069,240 | A | 12/1962 | Armand |
| 3,086,886 | A | 4/1963 | Kieffer et al. |
| 4,094,731 | A | 6/1978 | Keyser et al. |
| 4,097,584 | A | 6/1978 | Reuschel et al. |
| 4,124,410 | A | 11/1978 | Kotval et al. |
| 4,193,974 | A | 3/1980 | Kotval et al. |
| 4,193,975 | A | 3/1980 | Kotval et al. |
| 4,195,067 | A | 3/1980 | Kotval et al. |
| 4,200,621 | A | 4/1980 | Liaw et al. |
| 4,246,249 | A | 1/1981 | Dawless |
| 4,256,717 | A | 3/1981 | Dawless |
| 4,304,763 | A | 12/1981 | Dietl et al. |
| 4,312,846 | A | 1/1982 | Dawless et al. |
| 4,312,847 | A | 1/1982 | Dawless |
| 4,312,848 | A | 1/1982 | Dawless |
| 4,312,849 | A | 1/1982 | Kramer |
| 4,312,850 | A | 1/1982 | Dietl et al. |
| 4,354,987 | A | 10/1982 | Iya |
| 4,588,571 | A | 5/1986 | Bildl |
| 4,612,179 | A | 9/1986 | Sanjurjo et al. |
| 4,676,968 | A | 6/1987 | Sanjurjo et al. |
| 4,787,986 | A | 11/1988 | Dietl et al. |
| 4,822,585 | A | 4/1989 | Dawless |
| 4,900,532 | A | 2/1990 | Kurz et al. |
| 5,678,807 | A | 10/1997 | Cooper |
| 6,013,872 | A | 1/2000 | Woditsch et al. |
| 6,585,797 | B2 | 7/2003 | Kinosz et al. |
| 6,632,413 | B2 | 10/2003 | Clark et al. |
| 7,381,392 | B2 | 6/2008 | Enebakk et al. |
| 7,682,585 | B2 | 3/2010 | Lynch et al. |
| 7,727,503 | B2 | 6/2010 | Nichol |
| 7,780,938 | B2 | 8/2010 | Kutsovsky et al. |
| 7,883,680 | B2 | 2/2011 | Nichol |
| 7,959,730 | B2 * | 6/2011 | Nichol ............................ 117/74 |
| 8,273,176 | B2 * | 9/2012 | Nichol ............................ 117/74 |
| 2005/0139148 | A1 | 6/2005 | Fujiwara et al. |
| 2006/0051670 | A1 | 3/2006 | Aramata et al. |
| 2008/0253955 | A1 | 10/2008 | Leblanc et al. |
| 2009/0092535 | A1 | 4/2009 | Nichol |
| 2009/0274596 | A1 | 11/2009 | Takahashi et al. |
| 2009/0274607 | A1 | 11/2009 | Nichol |
| 2010/0233064 | A1 | 9/2010 | Nichol |
| 2010/0329959 | A1 | 12/2010 | Nichol et al. |
| 2011/0044877 | A1 | 2/2011 | Turenne et al. |
| 2011/0129405 | A1 | 6/2011 | Nichol |
| 2011/0236290 | A1 | 9/2011 | Nichol |
| 2012/0255485 | A1 | 10/2012 | Nichol |

FOREIGN PATENT DOCUMENTS

| | | | |
|---|---|---|---|
| EP | 0459421 A1 | | 5/1991 |
| GB | 2052461 A | | 1/1981 |
| JP | 5319922 A | | 2/1978 |
| JP | 56022620 A | | 3/1981 |
| JP | 60103015 A | | 6/1985 |
| JP | 60122713 A | | 7/1985 |
| JP | 64069507 A | | 3/1989 |
| JP | 7247108 A | | 9/1995 |
| JP | 09055460 A | | 2/1997 |
| JP | 2002293528 A | | 10/2002 |
| JP | 2003238138 A | | 8/2003 |
| JP | 2003238139 A | | 8/2003 |
| JP | 2004535354 A1 | | 11/2004 |
| JP | 2004537491 A | | 12/2004 |
| JP | 2006027923 A | | 2/2006 |
| JP | 2007008789 A | | 1/2007 |
| JP | 2010540392 A | | 12/2010 |
| KR | 20100061567 A | | 6/2010 |
| TW | 200801262 A | | 1/2008 |
| TW | 200928019 A | | 7/2009 |
| WO | WO-9816466 A1 | | 4/1998 |
| WO | WO-0216265 A1 | | 2/2002 |
| WO | WO-03066523 A1 | | 8/2003 |
| WO | WO-2005063621 A1 | | 7/2005 |
| WO | WP-2007097046 A1 | | 8/2007 |
| WO | WO-2007112592 A1 | | 10/2007 |
| WO | WO-2009012583 A1 | | 1/2009 |
| WO | WO-2009043167 A1 | | 4/2009 |
| WO | WO-2011020197 A1 | | 2/2011 |

OTHER PUBLICATIONS

U.S. Appl. No. 12/244,839, Non-Final Office Action mailed Apr. 21, 2010, 16 pgs.

U.S. Appl. No. 12/244,839, Non-Final Office Action mailed Oct. 18, 2010, 6 pgs.

U.S. Appl. No. 12/244,839, Notice of Allowance mailed Feb. 16, 2011, 8 pgs.

U.S. Appl. No. 12/244,839, Preliminary Amendment filed Mar. 22, 2010, 8 pgs.

U.S. Appl. No. 12/244,839, Response filed Jun. 21, 2010 to Non Final Office Action mailed Apr. 21, 2010, 22 pgs.

U.S. Appl. No. 12/244,839, Response filed Jan. 18, 2011 to Non Final Office Action mailed Oct. 18, 2010, 12 pgs.

U.S. Appl. No. 12/288,857, Non-Final Office Action mailed Sep. 24, 2009, 9 pgs.

U.S. Appl. No. 12/288,857, Notice of Allowance mailed Apr. 5, 2010, 7 pgs.

U.S. Appl. No. 12/233,857, Preliminary Amendment filed Jul. 7, 2009, 7 pgs.

U.S. Appl. No. 12/288,857, Preliminary Amendment filed Oct. 23, 2008, 18 pgs.

U.S. Appl. No. 12/288,857, Response filed Dec. 21, 2009 to Non Final Office Action mailed Sep. 24, 2009, 10 pgs.

U.S. Appl. No. 12/670,263, Response filed Jan. 17, 2012 to Non Final Office Action mailed Sep. 14, 2011, 18 pgs.

U.S. Appl. No. 12/670,263, Response filed Jul. 23, 2012 to Final Office Action mailed Mar. 23, 2012, 14 pgs.

U.S. Appl. No. 12/670,263, Final Office Action mailed Mar. 23, 2012, 9 pgs.

U.S. Appl. No. 12/670,263, Non Final Office Action mailed Jul. 27, 2012, 15 pgs.

U.S. Appl. No. 12/670,263, Non Final Office Action mailed Sep. 14, 2011, 15 pgs.

U.S. Appl. No. 12/670,263, Preliminary Amendment filed Jan. 22, 2010, 7 pgs.

U.S. Appl. No. 12/729,561, Non Final Office Action mailed Sep. 29, 2011, 19 pgs.

U.S. Appl. No. 12/729,561, Notice of Allowance mailed Mar. 9, 2012, 7 pgs.

U.S. Appl. No. 12/729,561, Response filed Jan. 17, 2012 to Non Final Office Action mailed Sep. 29, 2011, 18 pgs.

U.S. Appl. No. 12/729,561, Response filed Jul. 22, 2011 to Restriction Requirement mailed Jul. 6, 2011, 8 pgs.

U.S. Appl. No. 12/729,561, Restriction Requirement mailed Jul. 6, 2011, 6 pgs.

U.S. Appl. No. 12/784,576, Amendment filed Dec. 15, 2010, 6 pgs.

U.S. Appl. No. 12/734,576, Notice of Allowance mailed Sep. 24, 2010, 9 pgs.

U.S. Appl. No. 12/784,576, PTO Response to 312 Amendment mailed Dec. 30, 2010, 2 pgs.

U.S. Appl. No. 13/017,786, Non Final Office Action mailed Oct. 10, 2012, 6 pgs.

U.S. Appl. No. 13/017,786, Non Final Office Action mailed Nov. 22, 2011, 16 pgs.

U.S. Appl. No. 13/017,786, Notice of Allowance mailed Mar. 16, 2012, 8 pgs.

U.S. Appl. No. 13/017,786, Preliminary Amendment filed Feb. 28, 2011, 4 pgs.

U.S. Appl. No. 13/017,786, Response filed Jan. 27, 2012 to Non Final Office Action mailed Nov. 22, 2011, 7 pgs.

U.S. Appl. No. 13/158,626, Non Final Office Action Mailed Jan. 3, 2012, 4 pgs.

U.S. Appl. No. 13/158,626, Notice of Allowance mailed May 25, 2012, 9 pgs.

U.S. Appl. No. 13/158,626, Preliminary Amendment filed Jul. 12, 2011, 4 pgs.

(56) References Cited

OTHER PUBLICATIONS

U.S. Appl. No. 13/158,626, Response filed Mar. 30, 2012 to Non Final Office Action mailed Jan. 3, 2012, 10 pgs.
U.S. Appl. No. 13/532,083, Non Final Office Action mailed Jan. 24, 2013, 12 pgs.
Application Serial No. 200880108159.8, Office Action mailed Nov. 24, 2011, 6 pgs.
Australian Application Serial No. 2007234343, Examiner Report mailed Mar. 1, 2011, 2 pgs.
Australian Application Serial No. 2007234343, Response Sep. 12, 2011 to Office Action mailed Aug. 16, 2011, 16 pgs.
Australian Application Serial No. 2007234343, Response filed Feb. 17, 2011 to Examiner's First Report mailed Feb. 17, 2010, 13 pgs.
Australian Application Serial No. 2007234343, Response filed Jul. 12, 2011 to Office Action mailed Mar. 1, 2011, 2 pgs.
Australian Application Serial No. 2007234343. Office Action mailed Feb. 17, 2010, 2 pgs.
Australian Application Serial No. 2007234343. Office Action mailed Aug. 9, 2011, 2 pgs.
Canadian Application No. 2,700,997, Notice of Allowance mailed Jan. 3, 2012, 1 pg.
Canadian Application No. 2,700,997, Office Action mailed May 25, 2011, 2 pgs.
Canadian Application No. 2,700,997, Response filed Sep. 7, 2011 to office action mailed May 25, 2011, 49 pgs.
Canadian Application Serial No. 2,648,288, Notice of Allowance mailed Dec. 14, 2011, 1 pg.
Canadian Application Serial No. 2,648,288, Office Action mailed Mar. 3, 2011, 4 Pgs.
Canadian Application Serial No. 2,648,288, Office Action mailed May 25, 2010, 5 pgs.
Canadian Application Serial No. 2,648,288, Response filed Sep. 1, 2011 to Office Action mailed Mar. 3, 2011, 19 pgs.
Canadian Application Serial No. 2,648,288, Response filed Nov. 24, 2010, 8 pgs.
Canadian Application Serial No. 2,694,806, Office Action mailed Oct. 11, 2011, 3 pgs.
Chinese Application Serial No. 200780019595.3, Office Action mailed Feb. 1, 2011, with English translation, 20 pgs.
Chinese Application Serial No. 200780019595.3, Response filed Jun. 16, 2011 to Office Action mailed Feb. 1, 2011, with English translation, 20 pgs.
Chinese Application Serial No. 200880115808.7, Office Action mailed Sep. 13, 2012, with English translation, 13 pgs.
Chinese Application Serial No. 200880115808.7, Response filed Jan. 28, 2013 to Office Action mailed Sep. 13, 2012, with English claims, 13 pgs.
Chinese Application Serial No. 2008801158087, Office Action mailed Feb. 28, 2012, With English Translation, 9 pgs.
Chinese Application Serial No. 2008801158087, Response filed Jul. 16, 2012 to Office Action mailed Feb. 28, 2012, with English claims, 15 pgs.
European Application Serial No. 08836257.9, Response filed Sep. 20, 2012 to Extended Search Report mailed Feb. 28, 2012, 14 pgs.
European Application Serial No. 07719504.8, Amended Claims mailed Jan. 2, 2009, 9 pgs.
European Application Serial No. 07719504.8, Extended European Search Report mailed Feb. 27, 2012, 12 pgs.
European Application Serial No. 08836257.9, Office Action mailed Dec. 19, 2012, 5 pgs.
European Application Serial No. 08836257.9, Supplemental Search Report mailed Feb. 28, 2012, 9 pgs.
International Application Serial No. PCT/CA2007/000574, Preliminary Report on Patentability mailed Oct. 16, 2008, 9 pgs.
International Application Serial No. PCT/CA2007/000574, Search Report and Written Opinion mailed Jul. 27, 2007, 13 pgs.
International Application Serial No. PCT/CA2008/001345, International Search Report and Written Opinion mailed Oct. 17, 2008, P220, 14 pgs.
International Application Serial No. PCT/CA2008/001750, International Search Report and Written Opinion mailed Jan. 22, 2009, 11 pgs.
International Application Serial No. PCT/CA2010/001288, International Preliminary Report on Patentability mailed Mar. 1, 2012, 7 pgs.
International Application Serial No. PCT/US2010/001288, International Search Report mailed Nov. 22, 2010, 3 pgs.
International Application Serial No. PCT/US2010/001288, Written Opinion mailed Nov. 22, 2010, 5 pgs.
Japanese Application Serial No. 2009-503383, Notice of Grounds of Rejection mailed Dec. 27, 2011, with English translation, 9 pgs.
Japanese Application Serial No. 2009-503383, Office Action mailed Jun. 26, 2012, With English Translation, 6 pgs.
Japanese Application Serial No. 2009-503383, Response filed May 25, 2012 to Notice of Grounds of Rejection mailed Dec. 27, 2011, (w/ English Translation of Claims), 26 pgs.
Japanese Application Serial No. 2010-527304, Office Action mailed Sep. 27, 2012, With English Translation, 7 pgs.
Korean Application Serial No. 10-2008-7026844, Office Action mailed Dec. 17, 2010, English translation, 3 pgs.
Korean Application Serial No. 10-2010-7003366, Office Action mailed Apr. 30, 2012, with English summary, 4 pgs.
Korean Application Serial No. 10-2010-7008996, Office Action mailed Apr. 30, 2012, with English summary, 5 pgs.
Korean Application Serial No. 10-2010-7008996, Response filed Jul. 30, 2012 to Office Action mailed Apr. 30, 2012, English translation, 2 pgs.
Malaysia Application Serial No. PI20083943, Examiner's Search Report mailed Nov. 15, 2011, 7 pgs.
Malaysian Application Serial No. PI 20083943, Office Action mailed Nov. 13, 2008, 42 pgs.
Russian Application Serial No. 2008143439, Office Action mailed Mar. 21, 2011, with English translation, 6 pgs.
Bathey, B. R., et al., "Review Solar-grade silicon", Journal of Materials Scence 17, (1982), 3077-3096.
Srivastava, et al., ""Synthesis, characterizations and applications of some nanomaterials (Ti02 and SiC nanostructured films,organized CNT structures, ZnO structures and CNT-blood platelet clusters).""", Pramana—J. Phys, (2005), 65, 4, 581-592. Pages.
U.S. Appl. No. 13/017,786 , Response filed Apr. 9, 2013 to Non Final Office Action mailed Oct. 10, 2012, 6 pgs.
U.S. Appl. No. 13/017,786, Supplemental Preliminary Amendment and Petition to Revive filed Feb. 5, 2013, 18 pgs.
Chinese Application Serial No. 200880115808.7, Office Action mailed May 9, 2013, 5 pgs.
European Application Serial No. 08836257.9, Response filed Apr. 19, 2013 to Office Action mailed Dec. 19, 2012, 9 pgs.

\* cited by examiner

METHOD FOR PROCESSING SILICON POWDER TO OBTAIN SILICON CRYSTALS

CROSS-REFERENCE

This application is a continuation of and claims the benefit of priority under 35 U.S.C. §120 to U.S. patent application Ser. No. 13/158,626, filed on Jun. 13, 2011, which is a continuation of and claims the benefit of priority under 35 U.S.C. §120 to U.S. patent application Ser. No. 12/244,839, filed on Oct. 3, 2008, and now issued as U.S. Pat. No. 7,959,730, which claims the benefit of priority under 35 U.S.C. §119(e) to U.S. Provisional Patent Applications Ser. No. 60/977,249, filed Oct. 3, 2007, the benefit of priority of each of which is claimed hereby, and each of which are herein incorporated by reference in their entirety.

BACKGROUND

Silicon powder may be generated during the manufacture of crystalline solar cells as wire saws or band saws are used to trim the dimensions of a multicrystalline or monocrystalline ingot. In addition, silicon powder may be created during the cutting of silicon blocks or boules into wafers by wire saws, such as during the semiconductor wafer manufacturing process. Grinding or crushing processes may also create silicon powder. The silicon powder is generally considered scrap, as it may be mixed with a variety of impurities, such as iron, water, polyethylene glycol and silicon carbide.

Because the silicon in the powder has such a high surface area, it is difficult to prevent contact with oxygen which then forms silicon dioxide. A vacuum or inert gas atmosphere has traditionally been utilized to help prevent such oxidation, but challenges remain. The vacuum pump may disturb the powder and if the silicon powder is melted, it requires expensive and elaborate processing steps to remove the high levels of contaminants.

The amount of silicon powder generated and ultimately discarded may be upwards of 45% of the original silicon amount handled. Current attempts at recycling the powder are typically expensive, do not reach the required purity for solar silicon, are time consuming and/or are not economically feasible.

BRIEF DESCRIPTION OF THE DRAWINGS

In the drawings, which are not necessarily drawn to scale, like numerals describe substantially similar components throughout the several views. Like numerals having different letter suffixes represent different instances of substantially similar components. The drawings illustrate generally, by way of example, but not by way of limitation, various embodiments discussed in the present document.

SUMMARY

Figure 1:
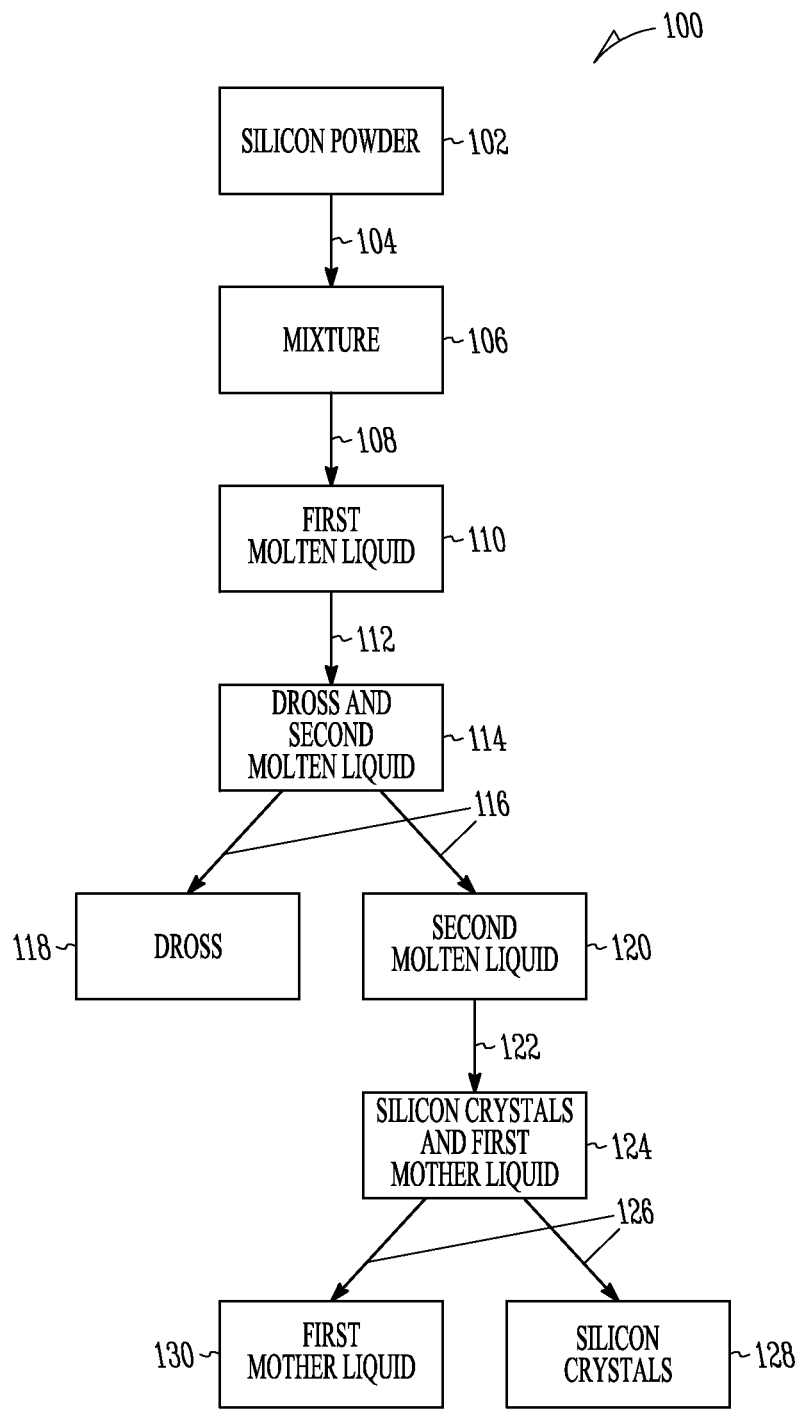
FIG. 1 illustrates a block flow diagram of a method of obtaining silicon crystals from silicon powder, according to some embodiments.

Embodiments of the present invention relate to a process for obtaining silicon crystals from silicon powders. The method includes contacting silicon powder with a solvent metal to provide a mixture containing silicon, melting the silicon under submersion to provide a first molten liquid, contacting the first molten liquid with a first gas to provide dross and a second molten liquid, separating the dross and the second molten liquid, cooling the second molten liquid to form first silicon crystals and a first mother liquid and separating the first silicon crystals and the first mother liquid.

DETAILED DESCRIPTION

The following detailed description includes references to the accompanying drawings, which form a part of the detailed description. The drawings show, by way of illustration, specific embodiments in which the invention may be practiced. These embodiments, which are also referred to herein as "examples," are described in enough detail to enable those skilled in the art to practice the invention. The embodiments may be combined, other embodiments may be utilized, or structural, and logical changes may be made without departing from the scope of the present invention. The following detailed description is, therefore, not to be taken in a limiting sense, and the scope of the present invention is defined by the appended claims and their equivalents.

In this document, the terms "a" or "an" are used to include one or more than one and the term "or" is used to refer to a nonexclusive "or" unless otherwise indicated. In addition, it is to be understood that the phraseology or terminology employed herein, and not otherwise defined, is for the purpose of description only and not of limitation. Furthermore, all publications, patents, and patent documents referred to in this document are incorporated by reference herein in their entirety, as though individually incorporated by reference. In the event of inconsistent usages between this document and those documents so incorporated by reference, the usage in the incorporated reference should be considered supplementary to that of this document; for irreconcilable inconsistencies, the usage in this document controls.

In the methods of manufacturing described herein, the steps can be carried out in any order without departing from the principles of the invention, except when a temporal or operational sequence is explicitly recited. Recitation in a claim to the effect that first a step is performed, then several other steps are subsequently performed, shall be taken to mean that the first step is performed before any of the other steps, but the other steps can be performed in any suitable sequence, unless a sequence is further recited within the other steps. For example, claim elements that recite "Step A, Step B, Step C, Step D, and Step E" shall be construed to mean step A is carried out first, step E is carried out last, and steps B, C, and D can be carried out in any sequence between steps A and E, and that the sequence still falls within the literal scope of the claimed process. A given step or sub-set of steps may also be repeated.

Furthermore, specified steps can be carried out concurrently unless explicit claim language recites that they be carried out separately. For example, a claimed step of doing X and a claimed step of doing Y can be conducted simultaneously within a single operation, and the resulting process will fall within the literal scope of the claimed process.

Embodiments of the invention relate to a process for obtaining silicon crystals from silicon powder. The process allows for economic recovery of silicon from spent slurry or silicon scrap, created by silicon manufacturing processes. In addition, the process produces silicon with a purity that meets the required level desirable for use as a starting product in various applications, thus recovering a product that otherwise would go to waste or be too expensive to recover by current or traditional means. Because the silicon is melted under submersion with a solvent metal, the process minimizes or eliminates the reaction with oxygen. This can eliminate expensive and complicated steps in purifying silicon, such as using vacuums or an inert gas atmosphere. Processes of the present invention may provide for a purified silicon having a purity level approaching that of an electronics grade polysilicon or surpassing that of a UMG (Upgraded Metallurgical Grade) silicon source. In addition, the processes for obtaining purified or recycled silicon described herein may use less energy resources (e.g., up to about 90% less electricity) than those manufacturing processes that provide for a purified silicon from metallurgical grade silicon as the sole silicon source. Additionally, the processes for obtaining purified or recycled silicon described herein may provide for the recovery and recycling of a highly desired product from waste material.

Definitions

As used herein, "silicon powder" refers to a mixture of silicon and one or more substantive impurities. Some of the common impurities from the cutting or grinding process are iron, aluminum, calcium and copper which may be introduced from the saw blade or wire used to cut the silicon source. The impurities may be substantive in that they prevent the silicon from meeting commercial or manufacturing standards for use. Silicon powder may be generated during the creation of crystalline solar cells when wire saws or band saws are used to trim multicrystalline or monocrystalline ingots, for example. Other manufacturing processes, such as the production of silicon wafers or an IC back-grind process may produce silicon powder or scrap silicon. UMG (Upgraded Metallurgical Grade) silicon refers to metallurgical grade silicon that has purified using metallurgical processes to provide solar grade silicon. Such processes typically do not provide for the equivalent purity required for Electronics Grade Silicon.

As used herein, "submersion" or "submerging" refers to limiting partially or completely the contact a component of a solution or mixture has with the environment at the surface of the solution or mixture. For example, a powder may be submerged in a solution such that after it enters the solution, the powder remains substantially isolated from the surface of the solution or mixture.

As used herein, "mixture" refers to a combination of two or more substances in physical contact with one another. For example, components of a mixture may be physically combined as opposed to chemically reacting.

As used herein, "melting" refers to a substance changing from a solid to a liquid when exposed to sufficient heat.

As used herein, "purifying" refers to the physical separation of a chemical substance of interest from foreign or contaminating substances.

As used herein, "contacting" refers to the act of touching, making contact, or of bringing substances into immediate proximity.

As used herein, "crystallizing" includes the process of forming crystals (crystalline material) of a substance, from solution. The process separates a product from a liquid feed stream, often in extremely pure form, by cooling the feed stream or adding precipitants which lower the solubility of the desired product so that it forms crystals. The pure solid crystals are then separated from the remaining liquor by decantation, filtration, centrifugation or other means.

As used herein, "crystalline" includes the regular, geometric arrangement of atoms in a solid.

As used herein, "decanting" or "decantation" includes pouring off a fluid, leaving a sediment or precipitate, thereby separating the fluid from the sediment or precipitate.

As used herein, "filtering" or "filtration" refers to a mechanical method to separate solids from liquids by passing the feed stream through a porous sheet such as a ceramic or metal membrane, which retains the solids and allows the liquid to pass through. This can be accomplished by gravity, pressure or vacuum (suction). The filtering effectively separates the sediment or precipitate from the liquid.

As used herein, "separating" refers to the process of removing a substance from another (e.g., removing a solid or a liquid from a mixture). The process can employ any technique known to those of skill in the art, e.g., decanting the mixture, skimming one or more liquids from the mixture, centrifuging the mixture, filtering the solids from the mixture, or a combination thereof.

As used herein, "filtering" refers to the process of removing solids from a mixture by passing the liquid through a filter, thereby suspending the solids on the filter.

As used herein, "skimming" refers to the process of removing one or more liquids, solids of combination there of from a mixture, wherein the one or more liquids are floating on top of the mixture.

As used herein, "agitating" refers to the process of putting a mixture into motion with a turbulent force. Suitable methods of agitating include, e.g., stirring, mixing, and shaking.

As used herein, "mother liquor" refers to the solid or liquid obtained after solids (e.g., crystals) are removed from a mixture of a solution of solids in a liquid. As such, the mother liquor will not include an appreciable amount of these solids.

As used herein, "silicon" refers to the chemical element that has the symbol Si and atomic number 14. As used herein, "metallurgical grade silicon" refers to relatively pure (e.g., at least about 96.0 wt. %) silicon.

As used herein, "molten" refers to a substance that is melted, wherein melting is the process of heating a solid substance to a point (called the melting point) where it turns into a liquid.

As used herein, "solvent metal" refers to one or more metals, or an alloy thereof, which upon heating, can effectively dissolve silicon, resulting in a molten liquid. Suitable exemplary solvent metals include, e.g., copper, tin, zinc, antimony, silver, bismuth, aluminum, cadmium, gallium, indium, magnesium, lead, an alloy thereof, and combinations thereof.

As used herein, an "alloy" refers to a homogeneous mixture of two or more elements, at least one of which is a metal, and where the resulting material has metallic properties. The resulting metallic substance usually has different properties (sometimes significantly different) from those of its components.

As used herein, "liquidus" refers to a line on a phase diagram above which a given substance is stable in the liquid phase. Most commonly, this line represents a transition temperature. The liquidus may be a straight line, or it may be curved, depending upon the substance. The liquidus is most often applied to binary systems such as solid solutions, including metal alloys. The liquidus may be contrasted to the solidus. The liquidus and solidus do not necessarily align or overlap; if a gap exists between the liquidus and solidus, then within that gap, the substance is not stable as either a liquid or a solid.

As used herein, "solidus" refers to a line on a phase diagram below which a given substance is stable in the solid phase. Most commonly, this line represents a transition temperature. The solidus may be a straight line, or it may be curved, depending upon the substance. The solidus is most often applied to binary systems such as solid solutions, including metal alloys. The solidus may be contrasted to the liquidus. The solidus and liquidus do not necessarily align or overlap. If a gap exists between the solidus and liquidus, then within that gap, the substance is not stable as either a solid or a liquid; such is the case, for example, with the olivine (fosterite-fayalite) system.

As used herein "evolve" or "evolve a gas" refers to the process in which a liquid or solid will undergo a chemical reaction or decomposition to release a gas under certain conditions (typically high temperature).

As used herein, "dross" refers to a mass of solid impurities floating on a molten metal bath. It appears usually on the melting of low melting point metals or alloys such as tin, lead, zinc or aluminum, or by oxidation of the metal(s). It can be removed, e.g., by skimming it off the surface. With tin and lead, the dross can also be removed by adding sodium hydroxide pellets, which dissolve the oxides and form a slag. With other metals, salt fluxes can be added to separate the dross. Dross is distinguished from slag, which is a (viscous) liquid floating on the alloy, by being solid.

As used herein, "slag" refers to by-product of smelting ore to purify metals. They can be considered to be a mixture of metal oxides; however, they can contain metal sulphides and metal atoms in the elemental form. Slags are generally used as a waste removal mechanism in metal smelting. In nature, the ores of metals such as iron, copper, lead, aluminum, and other metals are found in impure states, often oxidized and mixed in with silicates of other metals. During smelting, when the ore is exposed to high temperatures, these impurities are separated from the molten metal and can be removed. The collection of compounds that is removed is the slag. A slag can also be a blend of various oxides and other materials created by design, such as to enhance the purification of the metal As used herein, "inert gas" refers to any gas, or combination of gases, that is not reactive under normal circumstances. Unlike the noble gases, inert gas are not necessarily elemental and are often molecular gases. Like the noble gases, the tendency for non-reactivity is due to the valence, the outermost electron shell, being complete in all the inert gases. Exemplary inert gases include, e.g., helium (He), Neon (Ne), Argon (Ar) and nitrogen ($N_2$).

As used herein, "rotary degasser" refers to an apparatus for removing impurities from molten metal that includes a degasser shaft, an impeller block and a coupling. The shaft is preferably hollow to allow for the passage of gas therethrough. The impeller block is connected to the degasser shaft, is typically formed of heat resistant material and has at least one metal-transfer recess, which displaces molten metal when the block is rotated. The block preferably includes at least one gas inlet in communication with the hollow portion of the degasser shaft and a gas-release opening formed in each metal-transfer recess. Each gas-release opening communicates with one of the gas inlets. The coupling connects the degasser shaft to a drive shaft and is formed of two or more coupling members.

As used herein, "vortex" refers to a spinning, often turbulent, flow (or any spiral motion) with closed streamlines. The shape of media or mass swirling rapidly around a center forms a vortex. It flows in a circular motion.

As used herein, "directionally solidifying" refers to the solidification of molten metal so that feed metal is continually available for the portion undergoing solidification.

As used herein, "polycrystalline silicon" or "poly-Si" or "multicrystalline silicon" refers to a material consisting of multiple small silicon crystals.

As used herein, "monocrystalline silicon" refers to silicon that has a single and continuous crystal lattice structure with almost no defects or impurities.

As used herein, "ingot" refers to a mass of material cast into a shape which is relatively easy to handle and transport. For example, metal heated past its melting point and molded into a bar or block is referred to as an ingot.

As used herein, "boule" refers to a single-crystal ingot synthetically produced. For example, in the Czochralski or "CZ" process, a seed crystal is used to create a larger crystal, or ingot. This seed crystal is dipped into the pure molten silicon and slowly extracted. The molten silicon grows on the seed crystal in a crystalline fashion. As the seed is extracted the silicon sets and eventually a large, circular boule is produced.

Referring to FIG. 1, a block flow diagram 100 of a method of obtaining silicon crystals from silicon powder is shown, according to some embodiments. Silicon powder 102 may be contacted 104 with a solvent metal, to provide a mixture 106. The silicon in the mixture 106 may be melted 108 under submersion, to provide a first molten liquid 110. The first molten liquid 110 may be contacted 112 with a first gas to provide dross and a second molten liquid 114, which then may be separated 116 into dross 118 and a second molten liquid 120. The liquid 120 may be cooled 122 to form silicon crystals and a first mother liquor 124, which then may be separated 126 to a first mother liquor 130 and silicon crystals 128.

Silicon powder 102 for processing may be generated from a number of sources. The silicon powder 102 may be scrap or discarded silicon from manufacturing solar cell panels, semiconductor wafers or shaping ingots, for example. Often the silicon powder 102 is part of a slurry. The slurry may include water, polyethylene glycol (PEG), silicon carbide, iron, aluminum, calcium, copper and other contaminants. The silicon powder 102 may be removed from the slurry (e.g., separated) and dried to remove excess water. The powder may be separated from the slurry by centrifuge, settling or other processes. Adding water to the slurry can lower the specific gravity to help improve the settling or centrifuging. The silicon powder 102 may undergo further processing to remove contaminants, such as by undergoing an acid treatment, for example. For example, hydrochloric acid can be used to dissolve the metals, such as iron, off of the surface of the silicon powder. Hydrofluoric acid, hydrochloric acid, nitric acid or a combination thereof may be used to dissolve silicon dioxide off of the surface of the powder or to dissolve the surface of the powder. Alternatively, potassium hydroxide, sodium hydroxide or a combination thereof may be used to dissolve the surface of the powder. The powder may also be treated with a magnetic separating process to remove iron and other magnetic elements.

The silicon powder 102 may be contacted 104 with a solvent metal or molten silicon to form a mixture 106. In the mixture 105, the silicon in the powder may be melted 108 under submersion, thus limiting or preventing the silicon powder 102 from contacting an oxygenated environment. By limiting such contact with oxygen, the silicon in the silicon powder 102 has less chance to react to form the undesirable product silicon dioxide. By submerging the silicon powder 102 during melting, expensive and complicated steps are unnecessary, such as having to use a vacuum or inert gas atmosphere, for example. Additionally, prior to contacting silicon powder with a solvent metal, the powder may be pretreated with an acid treatment, magnetic separation, vacuum melting, drying or a combination thereof. One or more of these steps may facilitate the removal of contaminants, such as iron.

The silicon powder 102 may be contacted 104 with a solvent metal or molten silicon, such as by feeding into a vortex using a rotary degasser, molten metal pump, rotary furnace or by induction currents. The silicon powder 102 may be substantially dried and fed consistently into the vortex, thus limiting its contact with oxygen. The powder 102 may be sheared into individual grains, such as by setting the mixer settings for high shear. The melting 108 may occur under submersion in a molten bath. The bath may be below the liquidus temperature and above the solidus temperature, so that it is easier to put more shear on the powder and easier to keep the powder submerged in the bath due to the increased viscosity of the bath. The furnace refractory may be low in contaminates, such as by having little to no phosphorus or boron in the material. Fused silica may be an example of an acceptable refractory. Similarly, if a rotary degasser or molten metal pump is utilized, they may be manufactured with little phosphorus or boron to minimize contamination.

The mixture 106 may be kept submerged by utilizing melt turbulence. The melting 108 may occur under mixing conditions in which the temperature is maintained above the solidus temperature. The melting 108 may provide a first molten liquid 110. The steps of contacting 104 and melting 108 may be simultaneous or near simultaneous, for example. A salt flux or slag may be used on the surface of the melt to prevent oxygen from contacting the melt.

The solvent metal can include any suitable metal, combination of metals, or an alloy thereof, which upon heating, can effectively dissolve the silicon, resulting in a molten liquid. Suitable exemplary solvent metals include, e.g., silicon, copper, tin, zinc, antimony, silver, bismuth, aluminum, cadmium, gallium, indium, magnesium, lead, an alloy thereof, and combinations thereof. One specific solvent metal is aluminum, or an alloy thereof.

The silicon powder 102 and solvent metal can each be present in any suitable amount or ratio, provided the first molten liquid 110 can effectively be formed (after melting 108). For example, the silicon powder 102 can be employed in about 20 wt. % to about 50 wt. %, and aluminum, or an alloy thereof, can be employed as the solvent metal (103), in about 50 wt. % to about 80 wt. %. Utilizing silicon waste streams, the silicon powder 102 may be present in about 20% to about 90% or more. Aluminum, or an alloy thereof, may be then employed as the solvent metal in a ratio of less than about 10% to about 80% for example. The silicon powder 102 may be used as the only source of silicon or may be used as a percentage of the silicon added to the process. By varying the amounts and types of silicon used in the process, the chemistry of the resultant purified silicon may be changed or controlled.

The first molten liquid 110 may be contacted 112 with a first gas to provide a second molten liquid/dross mixture 114, which may be separated 116 into dross 118 and a second molten liquid 120. The first gas may be an inert gas. The first gas may be chlorine or a chlorine/inert gas mixture, such as chlorine/argon or chlorine/nitrogen mixture, for example. By using a molten solvent metal, such as aluminum, the first gas may be injected at a lower temperature than otherwise possible or feasible in pure molten silicon, allowing for increased removal of contaminants, such as silicon carbide. Alternatively, a salt flux may be utilized to remove silicon carbide and phosphorus from the first molten liquid 110. The salt flux may be added to the surface or mixed into the molten bath with drossing tools or a rotary furnace to remove silicon carbide. The salt flux may be low in phosphorous and boron, for example.

The first gas employed can be directly introduced into the vesicle containing the first molten liquid 110. The first gas may include oxygen, water, a hydrogen and inert gas mixture or a combination thereof, for example. In such a situation, at least one of chlorine ($Cl_2$), oxygen ($O_2$), nitrogen ($N_2$), helium (He), argon (Ar), hydrogen ($H_2$), sulfur hexafluoride ($SF_6$), phosgene ($COCl_2$), carbon tetrachloride $CCl_4$, water vapor ($H_2O$), oxygen ($O_2$), carbon dioxide ($CO_2$), carbon monoxide (CO), tetrachlorosilane ($SiCl_4$) and tetrafluorosilane ($SiF_4$) could be directly introduced into the vesicle containing the first molten liquid 110. Alternatively, the first gas employed can be introduced into the vesicle containing the first molten liquid 110 as a precursor that can effectively evolve the first gas. The precursor itself can be a solid or liquid or salt flux. Typically, the liquid or solid precursor will undergo a chemical reaction or decomposition to release the first gas, under the relatively high temperature of the first molten liquid.

In one specific embodiment, the first gas includes 100 wt. % chlorine ($Cl_2$). In another specific embodiment, the first gas includes chlorine ($Cl_2$) and nitrogen ($N_2$). In another specific embodiment, the first gas includes chlorine ($Cl_2$) and nitrogen ($N_2$), in a ratio of up to about 1:20.

Simultaneously or before contacting with the first gas, the liquid 110 may be contacted with an initial gas, such as air or a gas containing oxygen to facilitate the removal of boron and other impurities from the liquid. Contacting 112 may include injecting.

In one embodiment, the first molten liquid 110 can be cooled, prior to contacting 112 with the first gas. Specifically, the first molten liquid 110 can be cooled, prior to contacting 112 with the first gas, to near the liquidus temperature (e.g., within about 25° C., about 200° C., or about 500° C. of the liquidus temperature, above or below it). More specifically, the first molten liquid 110 can be cooled, prior to contacting 112 with the first gas, to a temperature of less than about 1000° C. More specifically, the first molten liquid 110 can be cooled, prior to contacting 112 with the first gas, to a temperature of about 750° C. to about 1300° C. or about 950° C. to about 1000° C., for example. The temperature is dependent on the amount of silicon in mixture 106.

Separating 116 may include removing the dross 118 from the surface of the molten liquid. The dross 118 can subsequently be removed from the second molten liquid 120, for example, using a skimmer. Typically, the dross 118 can be a grey/white powder, semi-solid dross with oxides mixed with mother liquor or black powder, located on the surface of the second molten liquid 120. In one embodiment, the rotary degasser can create a vortex of the second molten liquid 120, which can effectively mix the dross 118 in the second molten liquid 120. In such an embodiment, the vortex can contact oxygen to provide additional dross 118.

In one embodiment, the second molten liquid and dross 114 can be heated after the first molten liquid 110 is contacted 112 with the first gas and before the dross 118 and second molten liquid 120 are separated. Specifically, the second molten liquid 114 can be heated, above the liquidus temperature, after the first molten liquid 110 is contacted 112 with the first gas, and before the dross 118 and second molten liquid 120 are separated. More specifically, the second molten liquid 114 can be heated, to within about 20° C. above the liquidus temperature, after the first molten liquid 110 is contacted 112 with the first gas, and before the dross 118 and second molten liquid 120 are separated.

The second molten liquid 120 may be cooled to form silicon crystals (or first silicon crystals) in a first mother liquor 124, which may then be separated 126 into silicon crystals 128 (or first silicon crystals 128) and the first mother liquor 130. The silicon crystals 128 may be re-heated 132 and re-introduced into the process one or more times (see FIG. 2).

Figure 2:
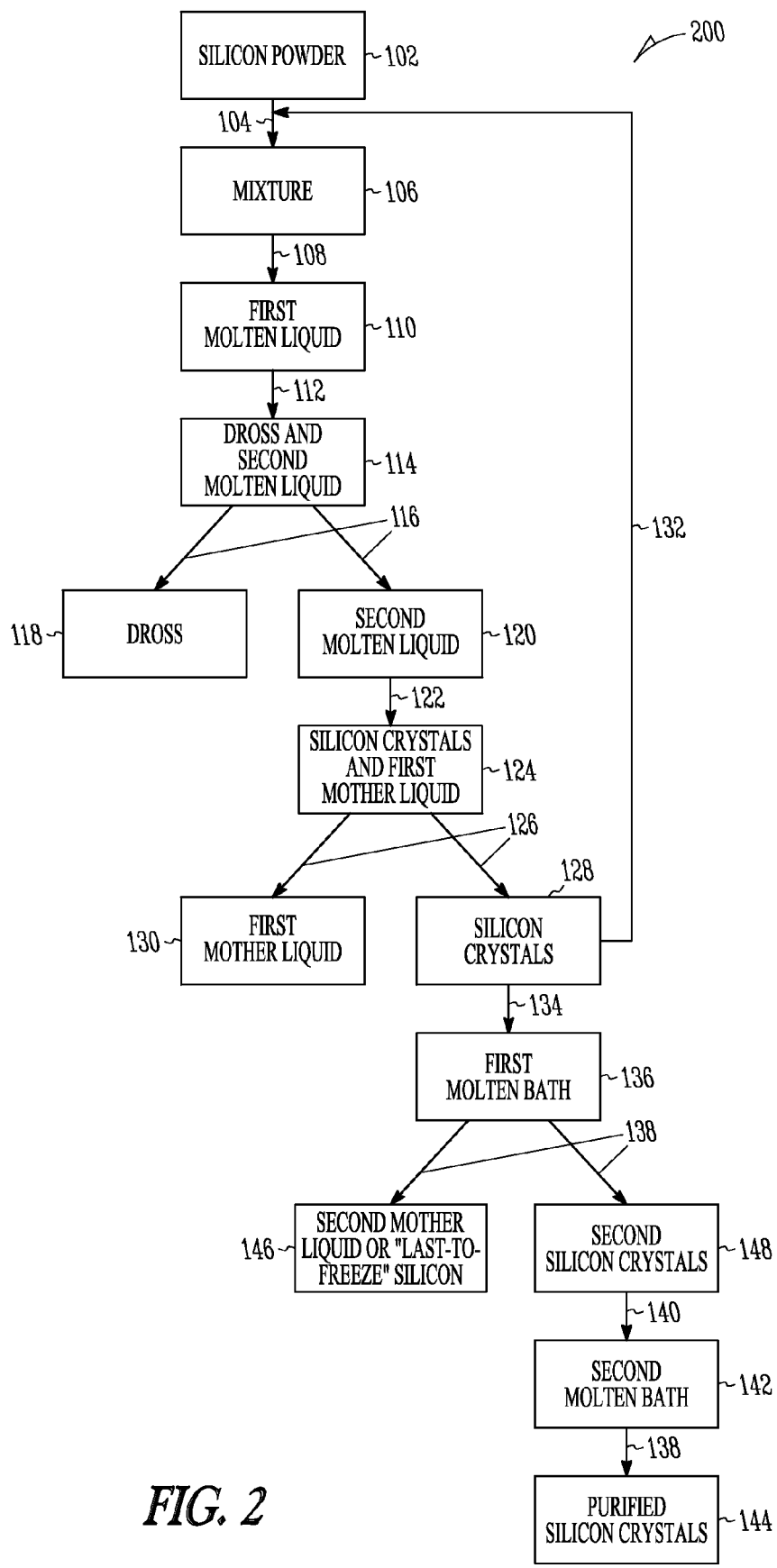
FIG. 2 illustrates a block flow diagram of a method of obtaining purified silicon crystals from silicon powder, according to some embodiments

The silicon crystals 128 may be heated 134 to provide a first molten bath 136 (see view 200 of FIG. 2). The first molten bath 136 may contacted with a second gas and be directionally solidified 138 to provide second silicon crystals 148 and a second mother liquor 146 or "last-to-freeze" silicon (contains most of the impurities). The second silicon crystals 148 may be heated 140 to provide a second molten bath 142, which may be optionally contacted 138 with a second gas and directionally solidified to provide purified silicon crystals 144.

As stated above, the second molten liquid 120 may be cooled 122 to provide first silicon crystals and a first mother liquor 124. In one embodiment, the second molten liquid 120 can be cooled 122 while agitating the second molten liquid 120. Without being bound to any particular theory, it is believed that during the cooling 122, agitating can provide relatively small silicon crystals, which can be difficult to strain, of a relatively high purity. A small amount of mixing can provide silicon crystals of about 1 mm (thickness), by about 5 mm (width), by about 5 mm (length).

Additionally, the second molten liquid 120 can be cooled 122 to any suitable and appropriate temperature (such as between the liquidus and solidus temperature), provided first silicon crystals are obtained in a first mother liquor 124. Specifically, the second molten liquid 120 can be cooled 122 to a temperature of about 585-1400° C. More specifically, the second molten liquid 120 can be cooled 122 close to, but above the solidus temperature (e.g., within about 200° C. above the solidus temperature, within about 125° C. above the solidus temperature, or within about 50° C. above the solidus temperature). More specifically, the second molten liquid 120 can be cooled 122 to a temperature of about 700° C. to about 750° C. More specifically, the second molten liquid 120 can be cooled 122 to above the solidus temperature and below the liquidus temperature. The second molten liquid 120 may be cooled to a temperature below the liquidus temperature, for example.

The second molten liquid 120 can be cooled 122 at any suitable any appropriate rate, provided first silicon crystals are obtained in a first mother liquor 124. For example, the second molten liquid 120 can be cooled 122 at a rate of less than about 100° C./hr, at a rate of less than about 50° C./hr, or at a rate of less than about 20° C./hr.

The second molten liquid 120 can be cooled 122 over any suitable and appropriate period of time, provided silicon crystals are obtained in a first mother liquor 124. For example, the second molten liquid 120 can be cooled 122 over a period of time of at least about 2 hours, at least about 4 hours or at least about 8 hours.

In one embodiment, the silicon crystals and the first mother liquor 124 can be separated 126. The separation can be carried out in any suitable and appropriate manner. For example, the separation can be carried out by pouring off the first mother liquid 130 from the silicon crystals 128 by straining. Alternatively, the separation can be carried out employing centrifugation.

In one specific embodiment, the first silicon crystals 128 obtained can be employed or re-used as the silicon in a subsequent purification (see element 132 of FIG. 2). This re-use can be carried out multiple times (e.g., 2, 3, 4 or 5), to provide first silicon crystals 128 having a requisite purity level.

As stated above, the first silicon crystals 128 are heated to form a first molten bath. The first silicon crystals 128 can be heated to any suitable and appropriate temperature, effective to form a first molten bath. Specifically, the first silicon crystals 128 can be heated to a temperature of about 1100° C. to about 1500° C. Additionally, in one embodiment, the first silicon crystals 128 can be heated in the presence of an inert gas, vacuum or a combination thereof. Suitable inert gases include, e.g., nitrogen ($N_2$), argon (Ar), or a combination thereof. Without being bound to any particular theory, it is believed that heating the first silicon crystals 128 in the presence of an inert gas can prevent the formation of a dross and/or slag that includes silicon dioxide ($SiO_2$) at the elevated temperature (e.g., about 1100° C. to about 1500° C.). Such an oxidation of silicon to silicon dioxide could otherwise reduce the overall yield of the purified silicon.

As stated above, the first molten bath 136 may be directionally solidified 138 to form second silicon crystals 148 and a second mother liquor 146. The direction solidification will allow crystals to form on the bottom of the vesicle (e.g., crucible), allowing the top part (i.e., molten) to be removed.

In one embodiment, the directional solidifying 138 includes heating the top portion of the first molten bath 136, cooling the bottom portion of the first molten bath 136, or a combination thereof. Alternatively, the first molten bath 136 can be cooled, to form second silicon crystals 148 and a second mother liquor 146. Alternatively, the directional solidifying 138 can include cooling the first molten bath 136 below the melting point, thereby forming second silicon crystals, and separating the upper portion and the lower portion; wherein the upper portion comprises a second mother liquor 146 and the lower portion comprises second silicon crystals.

As stated above, the second silicon crystals 148 are heated 140 to provide a second molten bath 142. The second silicon crystals 148 can be heated 140, at any suitable and appropriate temperature, effective to provide a second molten bath 142. Specifically, the second silicon crystals 148 are heated 140, to a temperature above the liquidus temperature, to provide a second molten bath 142. More specifically, the second silicon crystals 148 can be heated 140, to a temperature of at least about of at least about 1300° C., to provide a second molten bath 142.

The second molten bath 142 may be optionally contacted with a second gas 138 to provide a slag and/or dross that forms on the surface of a third molten bath. The second gas employed can be directly introduced into the vesicle containing the second molten bath. In such a situation, at least one of chlorine ($Cl_2$), oxygen ($O_2$), nitrogen ($N_2$), helium (He), argon (Ar), hydrogen ($H_2$), sulfur hexafluoride ($SF_6$), phosgene ($COCl_2$), carbon tetrachloride $CCl_4$, water vapor ($H_2O$), oxygen ($O_2$), carbon dioxide ($CO_2$), carbon monoxide (CO), tetrachlorosilane ($SiCl_4$) and tetrafluorosilane ($SiF_4$) could be directly introduced into the vesicle containing the second molten bath. Alternatively, the second gas employed can be introduced into the vesicle containing the second molten bath as a precursor that can effectively evolve the second gas. The precursor itself can be a solid or liquid. Typically, the liquid or solid precursor will undergo a chemical reaction or decomposition to release the second gas, under the relatively high temperature of the second molten bath.

In one embodiment, the second molten bath 142 can contact the second gas employing a rotary degasser. The rotary degasser can effectively introduce the second gas into the second molten bath 142. Additionally, the rotary degasser can effectively agitate (e.g., stir) the second molten bath while the second gas is introduced into the second molten bath.

As stated above, the second molten bath 142 may be directionally solidified 138 below the melting point, thereby forming purified silicon 144. In one embodiment, the directional solidification includes heating the top portion of the second molten bath 142, cooling the bottom portion of the second molten bath 142, or a combination thereof. Alternatively, the second molten bath 142 can be cooled, to provide silicon ingots.

EXAMPLE 1

Silicon powder is collected as a spent slurry from a manufacturing process, such as cutting of ingots to make solar panel cells. Most silicon carbide and polyethylene glycol is removed from the slurry and the silicon powder is dried to remove water. The powder is optionally treated with acid to further remove impurities before drying. The silicon powder is fed into a molten bath of aluminum and submerged. The silicon is fed using a rotary degasser and quickly submerged. The powder is sheared into individual grains. The powder is kept submerged by melt turbulence. The temperature is held above the solidus temperature.

Chlorine gas is injected into the mixture to remove silicon carbide, silicon dioxide, phosphorus and any other inclusions or precipitates formed. Dross is removed from the surface. The molten bath is then put through a fractional crystallization process to grow crystals in the bath. The temperature is raised above the liquidus temperature and then slowly lowered down to the close to the solidus temperature to grow primary silicon crystals in the bath. This process removes silicon carbide, iron and other elements that prefer to be in the melt rather than in the solidifying primary silicon crystals. The process should run for at least four hours. The temperature of the bath is kept homogeneous to prevent crystals from growing preferentially in one part of the bath. A top heater provides additional heat to the surface to prevent crystal growth on the surface of the bath.

The liquid is removed from the bath thereby leaving silicon crystals in the furnace. The molten liquid can be poured out of the bath, pumped or sucked out of the bath or released out of a hole in the bottom of the furnace. The silicon crystals form a network of primary silicon flakes that remain in the furnace as the liquid aluminum eutectic is poured out. Other methods of removing aluminum can be used, including filtering the metal or centrifugal separation. A strainer may be used to keep the solid crystals in the bath. The furnace is heated during pouring and is further heated after the liquid is poured out and the furnace is tilted to remove more of the aluminum eutectic. The above steps may be repeated by re-melting the first silicon crystals in aluminum and then growing the crystals again.

The silicon crystals are acid washed to remove any residual aluminum. The acid may be hydrochloric acid and water. The crystals are washed with water after the acid washing. The silicon flakes are melted under. Gas is injected into the molten silicon. The gas injection contains traces of oxygen and/or hydrogen-containing gases and/or inert gases.

The remaining aluminum is then removed using a directional solidification or gas injection. Directional solidification is done using a temperature gradient. Portions of the top, bottom or sides of the ingot may be trimmed to further remove impurities. The directional solidification may be repeated, if desired.

EXAMPLE 2

Silicon powder from a band saw is collected and allowed to settle to remove most of the water. The powder is then treated with a magnetic separation process to remove most of the loose iron. The powder is then treated with acid to remove any surface metals. The powder is then rinsed and dried under inert atmosphere to remove the remaining water. The dry powder is then fed onto the surface of a molten silicon bath. The dry powder may be fed in an inert atmosphere. The induction currents pull the powder down into the melt where it melts submerged. The induction currents are stopped and gas is injected into the molten bath, the slag, dross and inclusions like silicon carbide float to the top of the bath where they are removed. The molten silicon is then directional solidified to further remove impurities. The molten silicon may be filtered before directional solidification if required. The last silicon to freeze is then separated from the silicon ingot. Depending on the application additional directional solidifications may be required.

What is claimed is:

1. A process for obtaining silicon crystals from silicon powder, comprising:
    separating a silicon powder from a slurry;
    treating the separated silicon powder with acid treatment, vacuum melting, magnetic separation, drying or a combination thereof to provide a treated silicon powder;
    contacting the treated silicon powder with a solvent metal, to provide a mixture containing silicon;
    melting the silicon under submersion by feeding the silicon powder into a vortex within the solvent metal using a rotary degasser, rotary furnace, molten metal pump or induction currents, to provide a first molten liquid;
    contacting the first molten liquid with a first gas, to provide dross and a second molten liquid;
    separating the dross and the second molten liquid; and
    cooling the second molten liquid approximately homogenously to provide fractional crystallization to form first silicon crystals and a first mother liquid; and
    separating the first silicon crystals and the first mother liquid;
    wherein the silicon that is obtained from the last step of the process is used to make solar cells.

2. The method of claim 1, wherein the temperature of the first molten liquid is below the liquidus temperature of the first molten liquid and is above the solidus temperature of the first molten liquid.

3. The method of claim 1, further comprising drying the silicon powder after separating the silicon powder from the slurry.

4. The method of claim 1, wherein contacting the silicon powder with a solvent metal comprises feeding silicon powder into a molten bath.

5. The method of claim 1, wherein during the melting, the temperature is maintained above the solidus temperature of the first molten liquid.

6. The method of claim 1, wherein the solvent metal is selected from the group of silicon, molten silicon, copper, tin, zinc, antimony, silver, bismuth, aluminum, cadmium, gallium, indium, magnesium, lead, an alloy thereof, and combinations thereof.

7. The method of claim 1, further comprising after separating the first silicon crystals and the first mother liquid:
    melting the silicon crystals, to provide a first molten bath;
    contacting the first molten bath with a second gas;
    directionally solidifying the first molten bath, to provide second silicon crystals;
    heating the second silicon crystals, to provide a second molten bath;
    directionally solidifying the second molten bath to provide purified silicon;
    wherein the second gas comprises oxygen, water, a hydrogen and inert gas mixture, or a combination thereof.

8. The method of claim 1, further comprising acid washing the silicon crystals, sufficient to remove impurities, after separating the first silicon crystals and the first mother liquid.

9. The method of claim 8, further comprising melting the silicon crystals after separating the first silicon crystals and the first mother liquid.

10. The method of claim 1, wherein the first gas comprises at least one of chlorine ($Cl_2$), chlorine and inert gas, oxygen ($O_2$), nitrogen ($N_2$), helium (He), argon (Ar), hydrogen ($H_2$), sulfur hexafluoride ($SF_6$), phosgene ($COCl_2$), carbon tetrachloride $CCl_4$, water vapor ($H_2O$), oxygen ($O_2$), carbon dioxide ($CO_2$), carbon monoxide (CO), tetrachlorosilane ($SiCl_4$) and tetrafluorosilane ($SiF_4$).

11. The method of claim 1, wherein the second molten liquid is cooled to a temperature of less than the liquidus temperature of the second molten liquid.

12. The method of claim 1, wherein the second molten liquid is cooled to within about 125° C. above the solidus temperature of the second molten liquid, wherein the second molten liquid is cooled at a rate of less than about 75° C/hr, wherein the second molten liquid is cooled over a period of time of at least about 2 hours, or a combination thereof.

13. The method of claim 1, wherein the second molten liquid is cooled to above the solidus temperature of the second molten liquid and below the liquidus temperature of the second molten liquid.

14. A process for obtaining silicon crystals from silicon powder, comprising:
separating a silicon powder from a slurry;
treating the separated silicon powder with acid treatment, vacuum melting, magnetic separation, drying or a combination thereof to provide a treated silicon powder;
contacting the treated silicon powder with a solvent metal to provide a mixture containing silicon;
melting the silicon under submersion; to provide a first molten liquid;
contacting the first molten liquid with a first gas, to provide dross and a second molten liquid;
separating the dross and the second molten liquid;
cooling the second molten liquid approximately homogenously to provide fractional crystallization to form first silicon crystals and a first mother liquid;
separating the first silicon crystals and the first mother liquid; and
washing the first silicon crystals with acid.

15. The process of claim 14, wherein the solvent metal is selected from the group of silicon, molten silicon, copper, tin, zinc, antimony, silver, bismuth, aluminum, cadmium, gallium, indium, magnesium, lead, an alloy thereof, and combinations thereof.

16. The process of claim 14, wherein the first gas comprises at least one of chlorine ($Cl_2$), chlorine and inert gas, oxygen ($O_2$), nitrogen ($N_2$), helium (He), argon (Ar), hydrogen ($H_2$), sulfur hexafluoride ($SF_6$), phosgene ($COCl_2$), carbon tetrachloride $CCl_4$, water vapor ($H_2O$), oxygen ($O_2$), carbon dioxide ($CO_2$), carbon monoxide (CO), tetrachlorosilane ($SiCl_4$) and tetrafluorosilane ($SiF_4$).

17. The process of claim 14, further comprising:
melting the first silicon crystals, to provide a first molten bath;
contacting the first molten bath with a second gas, wherein the second gas comprises water vapor (H2O), and oxygen (O2), hydrogen (H2), an inert gas, or a combination thereof;
directionally solidifying the first molten bath, to provide second silicon crystals;
heating the second silicon crystals, to provide a second molten bath; and
directionally solidifying the second molten bath to provide purified silicon.

18. A process for obtaining silicon crystals from silicon powder, comprising:
separating a silicon powder from a slurry;
treating the separated silicon powder with acid treatment, vacuum melting, magnetic separation, drying or a combination thereof to provide a treated silicon powder;
contacting the treated silicon powder with a solvent metal, to provide a mixture containing silicon;
melting the silicon under submersion, to provide a first molten liquid;
contacting the first molten liquid with an initial gas;
contacting the first molten liquid with a first gas, to provide dross and a second molten liquid;
separating the dross and the second molten liquid;
cooling the second molten liquid approximately homogenously to provide fractional crystallization to form first silicon crystals and a first mother liquid; and
separating the first silicon crystals and the first mother liquid.

19. The method of claim 18, wherein after melting the silicon under submersion and before separating the dross and the second molten liquid, contacting the first molten liquid with a salt flux, wherein contacting the first molten liquid with a salt flux comprises adding the salt flux to the surface of the first molten liquid.

20. The method of claim 18, further comprising washing the first silicon crystals with acid after separating the first silicon crystals and the first mother liquid.

21. The method of claim 18, further comprising:
melting the first silicon crystals, to provide a first molten bath;
contacting the first molten bath with a second gas, wherein the second gas comprises water vapor (H2O), and oxygen (O2), hydrogen (H2) an inert gas, or a combination thereof;
directionally solidifying the first molten bath, to provide second silicon crystals;
heating the second silicon crystals, to provide a second molten bath; and
directionally solidifying the second molten bath to provide purified silicon.

22. The method of claim 18, wherein the solvent metal is selected from the group of silicon, molten silicon, copper, tin, zinc, antimony, silver, bismuth, aluminum, cadmium, gallium, indium, magnesium, lead, an alloy thereof, and combinations thereof.

23. The method of claim 18, wherein the first gas comprises at least one of chlorine ($Cl_2$), chlorine and inert gas, oxygen ($O_2$), nitrogen ($N_2$), helium (He), argon (Ar), hydrogen ($H_2$), sulfur hexafluoride ($SF_6$), phosgene ($COCl_2$), carbon tetrachloride $CCl_4$, water vapor ($H_2O$), oxygen ($O_2$), carbon dioxide ($CO_2$), carbon monoxide (CO), tetrachlorosilane ($SiCl_4$) and tetrafluorosilane ($SiF_4$).

* * * * *